United States Patent
Doi

(10) Patent No.: US 8,525,589 B2
(45) Date of Patent: Sep. 3, 2013

(54) POP SOUND REDUCTION CIRCUIT AND AUDIO CIRCUIT HAVING SUCH POP REDUCTION CIRCUIT FOR USE IN AUDIO AMPLIFIER

(75) Inventor: Masayuki Doi, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 13/321,221

(22) PCT Filed: Jun. 3, 2010

(86) PCT No.: PCT/JP2010/059804
§ 371 (c)(1),
(2), (4) Date: Nov. 18, 2011

(87) PCT Pub. No.: WO2011/010513
PCT Pub. Date: Jan. 27, 2011

(65) Prior Publication Data
US 2012/0105153 A1   May 3, 2012

(30) Foreign Application Priority Data

Jul. 21, 2009   (JP) .................................. 2009-170060

(51) Int. Cl.
*H03F 1/14* (2006.01)
(52) U.S. Cl.
USPC .......................................................... 330/51
(58) Field of Classification Search
USPC .......................................... 330/51; 381/94.5
See application file for complete search history.

(56) References Cited

U.S. PATENT DOCUMENTS

| 6,940,345 B2 * | 9/2005 | Nair et al. ........................ 330/51 |
| 2005/0084120 A1 | 4/2005 | Hagino |
| 2008/0219479 A1 | 9/2008 | Ibukuro |

FOREIGN PATENT DOCUMENTS

| JP | 2003-273653 | 9/2003 |
| JP | 2004-304441 | 10/2004 |
| JP | 2005-109654 | 4/2005 |
| JP | 2005-217613 | 8/2005 |
| JP | 2008-219686 | 9/2008 |
| JP | 2010-21775 | 1/2010 |

OTHER PUBLICATIONS

International Search Report and Written Opinion in PCT/JP2010/059804.

* cited by examiner

*Primary Examiner* — Steven J Mottola
(74) *Attorney, Agent, or Firm* — Cooper & Dunham LLP

(57) ABSTRACT

A disclosed pop sound reduction circuit reducing generation of pop sound at activation or deactivation of an audio amplifier includes a reference voltage circuit generating a reference voltage, a differential amplifier circuit having first and second inputs to amplify the audio signal based on a comparison between the first and second inputs, a triangular voltage generator circuit generating a triangular voltage, a voltage current convertor circuit generating a current proportional to the triangular voltage, a capacitor charged with the generated current to generate a voltage corresponding to the generated current, a constant voltage circuit generating a constant voltage, and a control circuit switching the triangular voltage into the constant voltage to be applied to the voltage current convertor circuit so as to increase the generated voltage if the voltage generated by the capacitor is below the reference voltage when the triangular voltage is equal to or below a predetermined voltage.

5 Claims, 5 Drawing Sheets

US 8,525,589 B2

POP SOUND REDUCTION CIRCUIT AND AUDIO CIRCUIT HAVING SUCH POP REDUCTION CIRCUIT FOR USE IN AUDIO AMPLIFIER

TECHNICAL FIELD

The invention generally relates to a pop sound reduction circuit and an audio circuit having such a pop sound reduction circuit for use in an audio amplifier, and particularly to a pop sound reduction circuit and an audio circuit having the pop sound reduction circuit capable of reducing a pop sound generated at the activation or deactivation of the audio amplifier. More specifically, the present invention relates to a technology suitable for carrying out a pop sound reduction operation.

BACKGROUND ART

It is well known that a speaker system sometimes generates an unusual crackling sound when a power supply of the audio amplifier is turned on or off or a standby mode of the audio amplifier is cancelled, or in a transition period while voltages of applicable sections of the audio amplifier circuit are rising. Such an unusual crackling sound is called a "pop sound" that is considerably annoying to a hearer and makes the hearer uncomfortable. Further, such a pop sound sometimes damages the speaker.

As a technology for reducing such a pop sound, Japanese Laid Open Patent Application No. 2004-304441 (hereinafter also referred to as a "Patent Document 1"), for example, discloses a technology to lower the generation of the pop sound by raising a reference voltage of the audio amplifier at the activation or deactivation of the audio amplifier such that the reference voltage of the audio amplifier exhibits a raised cosine waveform.

FIG. 4 is a circuit diagram illustrating an example of a such a related art pop sound reduction circuit disclosed in Patent Document 1, and FIG. 5 is a timing chart illustrating an operation example of the related art pop sound reduction circuit of FIG. 4. FIG. 5 illustrates waveforms of respective voltages at positions A4 through C4 and waveform of drain currents i401 and i402 of NMOS transistors M403 and N404 of FIG. 4.

In FIG. 4, when the power supply of the audio amplifier is turned on to supply a power voltage Vdd to the pop sound reduction circuit, a capacitor C401 is charged via a resistor R401 such that the voltage at A4 rises in a logarithmic curve. Since the voltage at A4 is supplied to respective gates of an NMOS transistor M401 and a PMOS transistor M402, the drain current i401 is changed based on the voltage at A4.

That is, if the voltage at A4 is low, the PMOS transistor M402 is in an on-state and the NMOS transistor M401 is in an off-state. Thus, little drain current i401 is flown.

When the voltage at A4 rises to turn on the NMOS transistor M401, the drain current i401 has begun to flow, and the amount of the drain current i401 increases with the increase of the voltage at A4. The combined resistance of the NMOS transistor M401 and PMOS transistor M402 is reduced to its minimum while the drain current i401 is increased to its maximum when the voltage at A4 is at around ½ of the voltage Vdd of the power supply voltage.

When the voltage at A4 increases further, on-resistance of the NMOS transistor M401 is further lowered. However, on-resistance of the PMOS transistor M402 is lowered further than that of the NMOS transistor M401. Accordingly, the drain current i401 has begun to decrease.

When the voltage at A4 is further increased approximately to the same level as the power supply voltage Vdd, the PMOS transistor M402 is turned off. Thus, no drain current i401 is flown.

At this moment, the drain current i401 is flown as the drain current of the NMOS transistor M403. Since the NMOS transistors M403 and M404 form a current mirror circuit, the drain current i402 of the NMOS transistor M404 is also flown as in the same manner as the drain current i401.

A capacitor C402 is charged with the drain current i402 so that the voltage of the capacitor C402 is raised. Note that if an audio reproduction circuit 401 outputs a constant output voltage (e.g., ground voltage), the voltage output at B4 is raised due to a change similar to a terminal voltage of the capacitor C402. This is because there is a proportional relationship between an output voltage of an operating amplifier 402 and the terminal voltage of the capacitor C402.

That is, the voltage at B4 has a voltage waveform that gradually rises at the beginning of the wave form, where the voltage at B4 is obtained immediately after the power supply is turned on, rapidly rises at a mid point of the voltage waveform, and gradually rises again toward an end point of the voltage waveform. Accordingly, a peak value of the voltage waveform at C4 may be suppressed, thereby lowering the pop sound.

In addition, Japanese Laid Open Patent Application No. 2005-109654 (hereinafter also referred to as a "Patent Document 2") discloses another technology for lowering the generation of the pop sound. In this technology, plural current source supplies are provided and the capacitor C402 of FIG. 4 is charged by switching the plural current source supplies to generate the voltage having the voltage waveform at B4 illustrated in FIG. 5.

However, in a case of the related art pop sound reduction circuit in FIG. 4, the voltage at A4 rises in a logarithmic curve. Accordingly, the voltage rapidly rises immediately after the power supply is turned on, but its rising rate gradually slows down with time. As a result, on-state duration of the PMOS transistor M402 shortens while on-state duration of the NMOS transistor M401 increases. Accordingly, an asymmetric waveform of the drain current is obtained unlike a symmetric waveform of the drain current i401 illustrated in FIG. 5.

Further, since a value of the drain current i401 varies with respective threshold voltages of the NMOS transistor M401 and the PMOS transistor M402, the drain current i401 is significantly varied based on manufacturing conditions of the transistors.

Moreover, with this configuration, the NMOS transistor M403 and the NMOS transistor M404 form a current mirror circuit, and the capacitor C402 is connected between a source and a ground voltage Vss of the NMOS transistor M404. Accordingly, the drain current of the NMOS transistor M404 is reduced as the voltage of the capacitor C402 rises. As a result, an accurate mirroring effect may not be obtained.

This indicates that the drain current i402 is significantly reduced and becomes significantly smaller than the drain current i401 with time. As a result, the symmetry of the drain current i402 illustrated in FIG. 5 is more significantly changed than that of the drain current i401.

Thus, a voltage change at B4 is gradual toward the end of the waveform, so that a longer time is required to set the reference voltage. In addition, frequent generation of harmonics in the voltage at B4 inhibits the effect of lowering the pop sound.

Further, if the plural current sources are provided to charge the capacitor corresponding to the capacitor C402 of FIG. 4, the malfunction of the pop sound reduction circuit of FIG. 4 may be fixed. However, in this case, the plural current sources to charge the capacitor are switched with time, and hence the harmonics are frequently generated in the voltage at the switching of the plural current sources.

Accordingly, in the related art pop sound reduction technologies, the voltage at an output end (at B) of a differential amplifier circuit gradually changes toward the end point of the voltage waveform generated after the power supply is turned on, so that a longer time is required to set the reference voltage and frequent generation of harmonics in the voltage at B suppresses the effect of lowering the pop sound.

SUMMARY OF THE INVENTION

Accordingly, it is a general object of the present invention to provide a novel and useful pop sound reduction circuit capable of reducing a pop sound generated when an audio amplifier is activated or deactivated, and also to provide an audio circuit having such a pop sound reduction circuit. More specifically, the present invention intends to provide a technology that is suitable for carrying out a stable pop sound reduction operation by eliminating one or more of drawbacks of the related art technologies.

According to an aspect of the invention, there is provided a pop sound reduction circuit for use in an audio amplifier configured to reduce generation of pop sound at activation or deactivation of the audio amplifier. The pop sound reduction circuit includes: a reference voltage circuit configured to generate a reference voltage; a differential amplifier circuit having a first input terminal capable of being applied with the reference voltage generated by the reference voltage circuit as a first input and a second input terminal supplied with an audio signal from an external audio source as a second input, the differential amplifier circuit configured to amplify the audio signal based on a comparison between the first input and the second input; a triangular voltage generator circuit configured to generate a triangular voltage at the activation or deactivation of the audio amplifier; a voltage current convertor circuit configured to acquire the triangular voltage generated by the triangular voltage generator circuit to generate a current proportional to the triangular voltage; a capacitor configured to be, at the activation of the audio amplifier, charged with the current proportional to the triangular voltage generated by the voltage current convertor to generate a voltage corresponding to the current proportional to the triangular voltage capable of being applied to the first input terminal of the differential amplifier circuit as the first input; a constant voltage circuit configured to generate a constant voltage; and a control circuit configured to measure, at the activation of the audio amplifier, the triangular voltage generated by the triangular voltage generator circuit and the voltage corresponding to the current proportional to the triangular voltage generated by the capacitor, respectively, and to switch between one of the triangular voltage generated by the triangular voltage generator circuit and the constant voltage generated by the constant voltage generator circuit to be applied to the voltage current convertor circuit. In the pop sound reduction circuit, if the voltage corresponding to the current proportional to the triangular voltage generated by the capacitor has not be raised to reach the reference voltage generated by the reference voltage circuit at a time where the triangular voltage generated by the triangular voltage generator circuit is reduced to be equal to or below a first predetermined voltage, the control circuit switches the triangular voltage generated by the triangular voltage generator circuit applied to the voltage current convertor circuit into the constant voltage generated by the constant voltage generator circuit to be applied to the voltage current convertor circuit so as to increase the voltage corresponding to the current proportional to the triangular voltage generated by the capacitor.

According to another aspect, there is provided an audio circuit for use in an audio amplifier that includes a differential amplifier circuit having a first input terminal capable of being applied with a reference voltage generated by a reference voltage circuit as a first input and a second input terminal supplied with an audio signal from an external audio source as a second input, the differential amplifier circuit configured to amplify the audio signal based on a comparison between the first input and the second input; and the aforementioned pop sound reduction circuit configured to reduce the generation of pop sound at the activation or deactivation of the audio amplifier.

Other objects, features, and advantages of the present invention will become more apparent from the following detailed description when read in conjunction with the accompanying drawings.

BEST MODE FOR CARRYING OUT THE INVENTION

Figure 1:
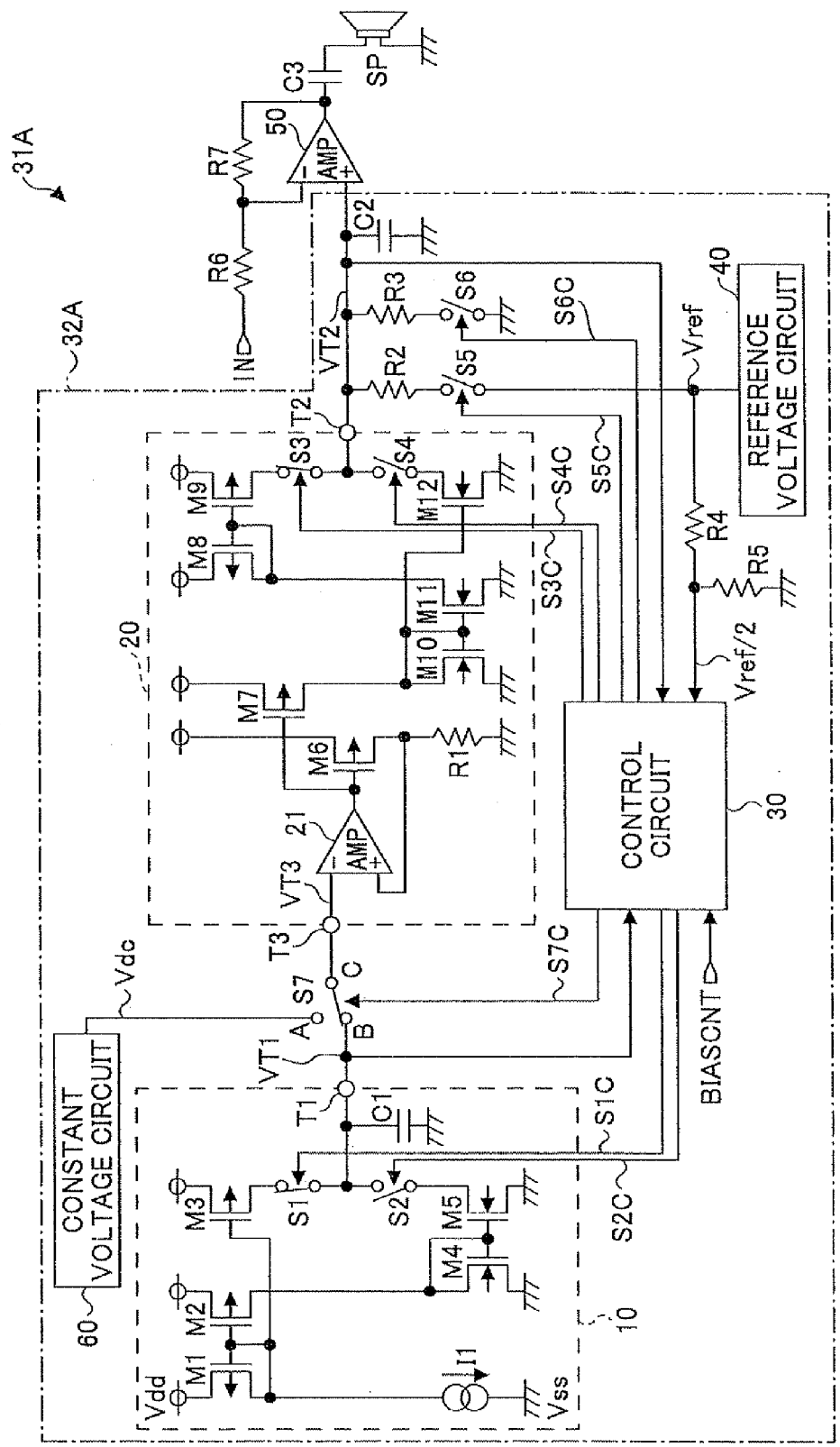
FIG. 1 is a block diagram illustrating a configuration example of a pop sound reduction circuit and an audio circuit having the pop sound reduction circuit according to an embodiment of the invention.

Preferred embodiments are described below, with reference to the FIGS. 1 through 5. FIG. 3 is a block diagram illustrating a configuration example of a pop sound reduction circuit and an audio circuit having the pop sound reduction circuit according to the first related art disclosed by applicants of the present invention in Japanese Patent Application No. 2008-180175.

The pop sound reduction circuit and the audio circuit having the pop sound reduction circuit disclosed in Japanese Patent Application No. 2008-180175 are devised to overcome the drawbacks of the technologies disclosed in the aforementioned Patent Documents 1 and 2. Detailed configurations and operations of the pop sound reduction circuit and the audio circuit having the pop sound reduction circuit according to the embodiment of the invention are described later with reference to FIG. 1.

As illustrated in FIG. 3, the audio amplifier 31 having a pop sound reduction circuit 32 disclosed in Japanese Patent Application No. 2008-180175 includes a triangular voltage generator circuit 10 configured to generate, when the audio amplifier 31 is activated or deactivated, a triangular voltage, a voltage current convertor circuit 20 configured to convert the generated voltage input thereto into a current in proportion to the input voltage and output the converted current, a capacitor C2 configured to be charged or discharged based on the converted current output from the voltage current convertor circuit 20, and a differential amplifier circuit 50 having a first input terminal to which a charging voltage of the capacitor C2 is input as a reference voltage and a second input terminal to which an audio signal is input.

An output current of the voltage current convertor circuit 20 that charges the capacitor C2 changes in proportion to the triangular voltage input thereto over time, and reaches approximately 0 A when the triangular voltage is approximately 0 V.

That is, in the pop sound reduction circuit 32 having the above configuration, when the audio amplifier 31 is activated or deactivated, the charging voltage of the capacitor C2 used as the reference voltage of the differential amplifier circuit 50 exhibits a transition of the voltage showing an approximately raised cosine waveform. Therefore, the pop sound generated at the activation or deactivation of the audio amplifier 31 may be reduced.

Moreover, the capacitor C2 is connected to a reference voltage circuit 40 via a resistor R2, or connected to a ground voltage via a resistor R3. Accordingly, the pop sound reduction circuit 32 is stabilized after the capacitor C2 is charged or discharged such that the voltage of the charged or discharged current forms the raised cosine waveform.

However, with the pop sound reduction circuit 32 having the above configuration, the current output from the voltage current convertor circuit 20 to charge the capacitor C2 may be reduced approximately to 0 A. In this condition, an output resistance of the voltage current convertor circuit 20 may result in high impedance, causing the pop sound reduction circuit 32 to be unstable.

Since the capacitor C2 is charged or discharged in such an unstable condition of the pop sound reduction circuit 32, the charging voltage of the capacitor C2 may not reach a desired voltage due to the noise or the leakage current derived from external factors.

If there is a difference between the charging voltage of the capacitor C2 and the desired voltage such as the reference voltage or the ground voltage, but the capacitor C2 is still connected to the reference voltage circuit 40 or to the ground voltage under such a voltage different condition, the pop sound may be generated due to the voltage difference.

FIG. 1 is a block diagram illustrating a configuration example of a pop sound reduction circuit 32A and an audio circuit 31A having the pop sound reduction circuit 32A according to an embodiment of the invention. The pop sound reduction circuit and the audio circuit having the pop sound reduction circuit illustrated in FIG. 1 may provide a more stable technology of pop sound reduction operation than the technology disclosed by the applicants of the invention in Japanese Patent Application No. 2008-180175 illustrated in FIG. 3 while partially employing the disclosed technology.

Below, detailed descriptions are given of configurations and operations of the pop sound reduction circuit 32A and the audio circuit 31A having the pop sound reduction circuit 32A according to the embodiment of the invention.

As illustrated in FIG. 1, the pop sound reduction circuit 32A according to the embodiment of the invention includes a triangular voltage generator circuit 10, a voltage current convertor circuit 20, a control circuit 30, a reference voltage circuit 40, a constant voltage circuit 60, a capacitor C2, switches S5 through S7, and resistors R2 through R5. The audio circuit 31A according to the embodiment of the invention includes the aforementioned pop sound reduction circuit 32A and a power amplifier unit including a differential amplifier circuit 50, resistors R6 and R7, a capacitor C3, and a speaker SP.

The triangular voltage generator circuit 10 includes PMOS transistors M1 through M3, NMOS transistors M4 and M5, a current source I1, switches S1 and S2, and a capacitor C1.

A source of the PMOS transistor M1 is connected to its power supply terminal Vdd and a drain thereof is connected to a ground terminal Vss via the current source I1. A gate of the PMOS transistor M1 is connected to respective gates of the PMOS transistors M2 and M3, and is also connected to a drain of the PMOS transistor M1 itself.

A source of the PMOS transistor M2 is connected to its power supply terminal Vdd and a drain thereof is connected to a drain of the NMOS transistor M4.

A source of the NMOS transistor M4 is connected to a ground terminal Vss, a gate thereof is connected to a gate of the NMOS transistor M5 and is also connected to a drain of the NMOS transistor M4 itself.

A drain of the NMOS transistor M5 is connected to a first terminal of the switch S1. A second terminal of the switch S2 is connected to a first terminal of the switch S2, a first terminal of the capacitor C1, and an output terminal T1 of the triangular voltage generator circuit 10. Further, a control terminal of the switch S2 is supplied with a control signal S2C output from a control circuit 30 described later.

Further, a second terminal of the switch S1 is connected to a drain of the PMOS transistor M3, and a control terminal of the switch S1 is supplied with a control signal S1C output from the control circuit 30. A source of the PMOS transistor M3 is connected to its power supply terminal Vdd.

In the triangular voltage generator circuit 10 having this configuration, the PMOS transistors M1 and M2, and M1 and M3 form a current mirror circuit, and the NMOS transistors M4 and M5 also form a current mirror circuit.

The switch S7 includes input terminals A and B, and an output terminal C The input terminal A is supplied with a constant constant voltage Vdc from a constant voltage circuit 60, and the input terminal B is connected with an output terminal T1 of the triangular voltage generator circuit 10. The output terminal C is connected with an input terminal T3 of the voltage current convertor circuit 20. Further, a control terminal of the switch S7 is supplied with a control signal S7C output from the control circuit 30.

The voltage to current converter circuit 20 includes an operational amplifier circuit 21, PMOS transistors M6 through M9, NMOS transistors M10 through and M12, switches 53 and S4, and a resistor R1.

An inverting terminal (−) of the operating amplifier circuit 21 is connected to an input terminal T3 of the voltage current convertor circuit 20 whereas a non-inverting terminal (+) of the operating amplifier circuit 21 is connected to a source of the PMOS transistor M6. An output terminal of the operating amplifier circuit 21 is connected to respective gates of the PMOS transistors M6 and M7.

A drain of the PMOS transistor M6 is connected to its ground terminal Vss via a resistor R1, and the source of the PMOS transistor M6 is connected to its power supply terminal Vdd.

Since a source of the PMOS transistor M7 is connected to its power supply terminal Vdd, the PMOS transistors M6 and M7 form a current mirror circuit. A drain of the PMOS transistor M7 is connected to a drain of the NMOS transistor M10.

A source of the NMOS transistor M10 is connected to its ground terminal Vss, a gate thereof is connected to respective gates of the NMOS transistors M11 and M12 and is also connected to a drain of the NMOS transistor M10 itself.

Since respective sources of the NMOS transistors M11 and M12 are connected to their ground terminals Vss, the NMOS transistors M10, and M11 and M12 form a current mirror circuit.

A drain of the NMOS transistor M11 is connected to a drain of the PMOS transistor M8. A source of the PMOS transistor M8 is connected to its power supply terminal Vdd and a gate thereof is connected to a gate of the PMOS transistor M9 and is also connected to a drain of the PMOS transistor M8 itself.

Since a source of the PMOS transistor M9 is connected to its power supply terminal Vdd, the PMOS transistors M8 and M9 form a current mirror circuit.

A drain of the NMOS transistor M12 is connected to a first terminal of the switch S4, and a second terminal of the switch S4 is connected to a first terminal of the switch S3. The second terminal of the switch S4 is also connected to respective first ends of resistors R2 and R3, and a capacitor C2 via an output terminal T2 of the voltage current convertor circuit 20. The second terminal of the switch S4 is further connected to an input terminal of the control circuit 30.

A drain of the PMOS transistor M9 is connected to a second terminal of the switch S2. Respective control terminals of the switches S3 and S4 are supplied with control signals S3C and S4C output from the control circuit 30.

A second terminal of the resistor R2 is connected to an output terminal of the reference voltage circuit 40 generating a reference voltage Vref via the switch S5. A second terminal of the resistor R3 is connected to its ground terminal Vss via the switch S6. A second terminal of the capacitor C2 is connected to its ground terminal Vss.

Respective control terminals of the switches S5 and S6 are supplied with control signals S5C and S6C output from the control circuit 30.

The control circuit 30 is supplied with a bias control signal BIASCNT, a ½ reference voltage Vref/2 obtained by dividing the reference voltage Vref between the resistors R4 and R5, an output voltage VT2 of the output terminal T2 of the voltage current convertor circuit 20, and on and off of each of the switches S1 through S6 is controlled based on the signals and voltages supplied to the control circuit 30.

Further, the control circuit 30 according to the embodiment includes a function to control on and off switching of the switch S7 based on the output voltage VT2 and an output voltage VT1 of the output terminal T1 of the triangular voltage generator circuit 10 supplied to the control circuit 30. The function to control on and off switching of the switch S7 is a special characteristic of the embodiment of the invention.

Note that a power amplifier unit configured to include a differential amplifier circuit 50, resistors R6 and R7, a capacitor C3, and a speaker SP is a general circuit configuration, and its description is thus omitted.

Figure 2:
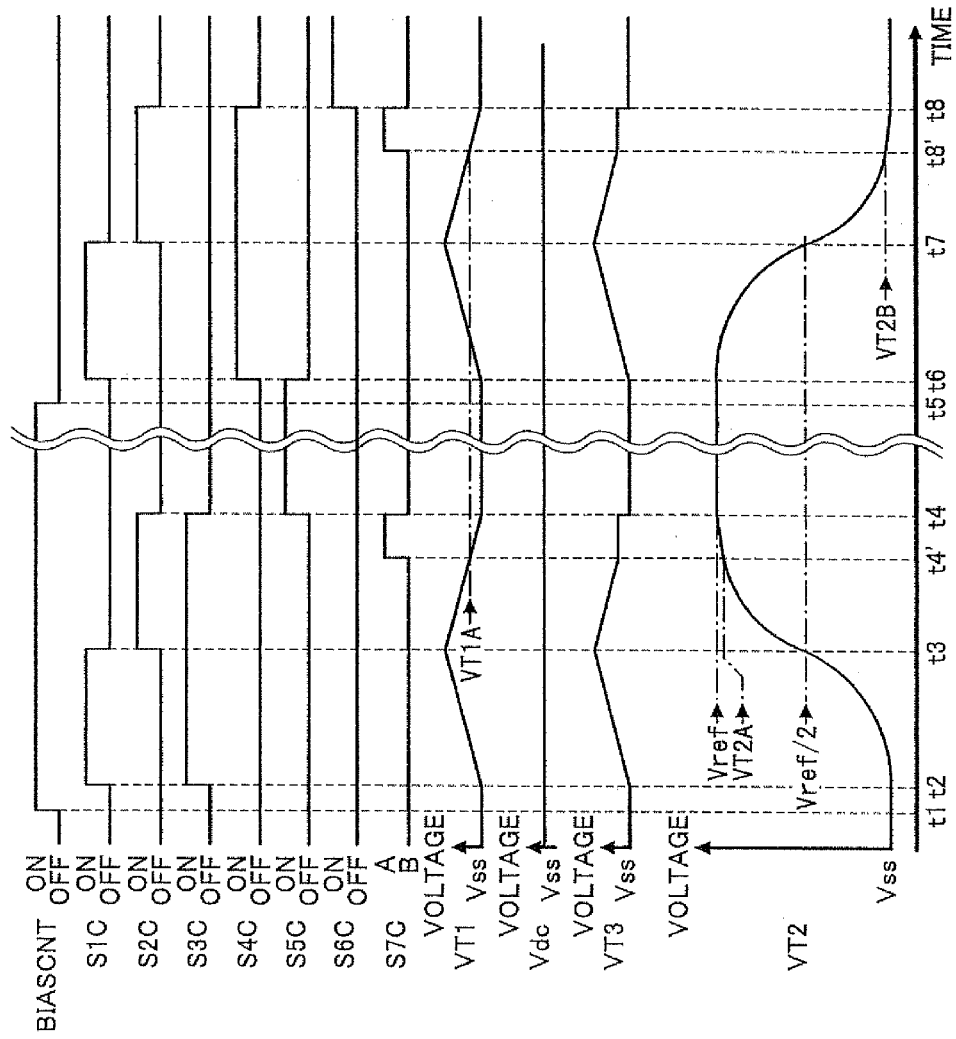
FIG. 2 is a timing chart illustrating waveforms of voltages and signals in the audio circuit according to the embodiment illustrated in FIG. 1.
Figure 3:
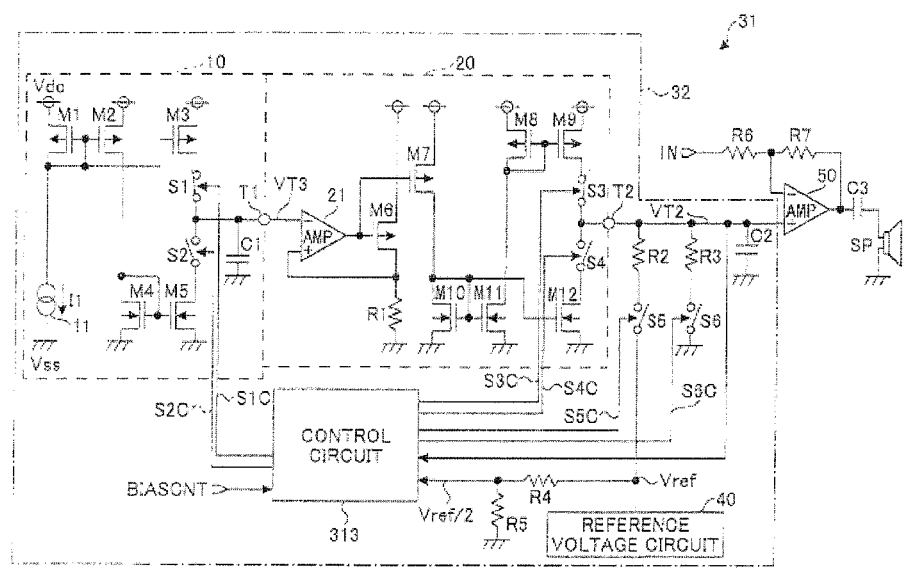
FIG. 3 is a block diagram illustrating a configuration example of a basic pop sound reduction circuit and an audio circuit having the pop sound reduction circuit according to a first related art.
Figure 4:
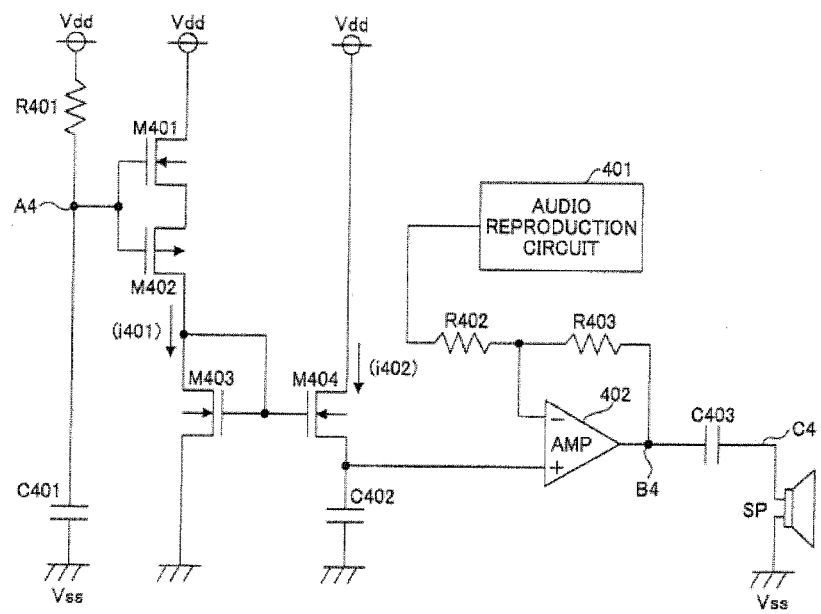
FIG. 4 is a block diagram illustrating a configuration example of an audio circuit having a pop sound reduction circuit according to a second related art.
Figure 5:
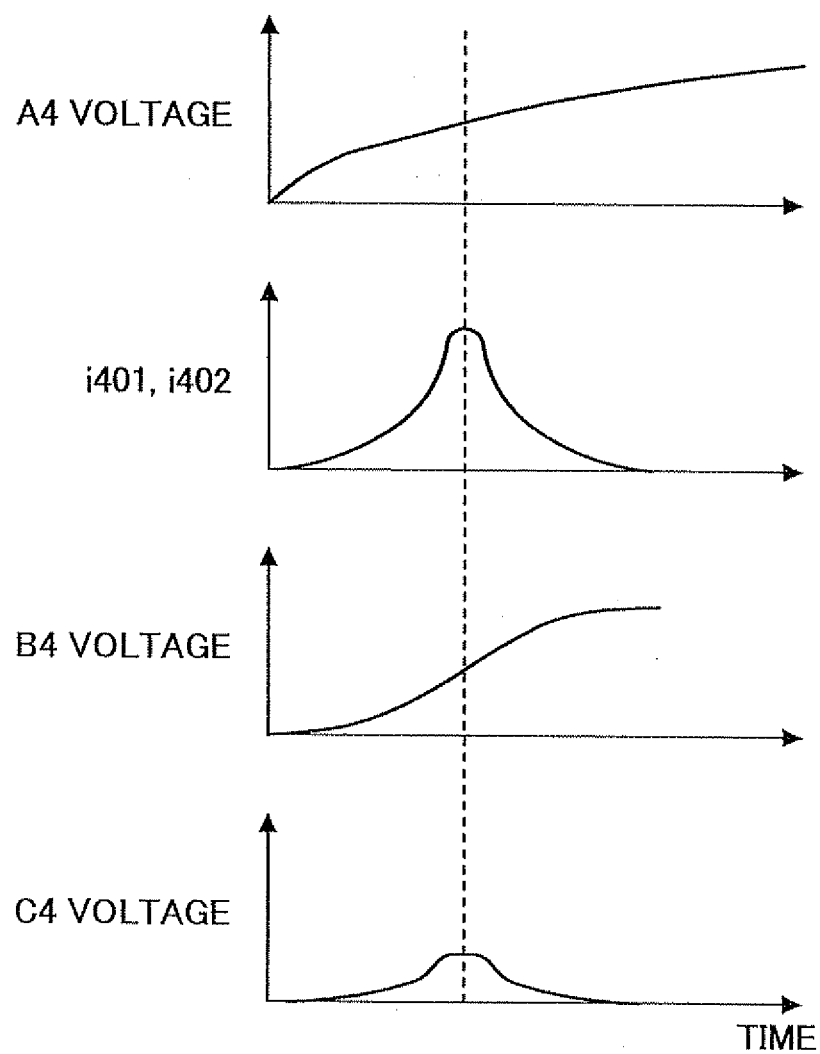
FIG. 5 is a timing chart illustrating an operational example of the audio circuit according to the second related art illustrated in FIG. 4.

FIG. 2 is a timing chart illustrating an operation of the pop sound reduction circuit 32A according to the embodiment illustrated in FIG. 1.

In FIG. 2, BIASCNT represents a bias control signal input to the control circuit 30, and S1C, S2C, S3C, S4C, S5C, S6C, and SC7 represent respective control signals of the switches S1 through S7 output from the control circuit 30.

Further, in FIG. 2, VT1, Vdc, VT3, and VT2 respectively represent a output voltage waveform of the output terminal T1 of the triangular voltage generator circuit 10, a constant voltage waveform output from the constant voltage circuit 60, an input voltage waveform of the input terminal T3 of the voltage current convertor circuit 20, and an output voltage waveform of the output terminal T2 of the voltage current convertor circuit 20.

Below, an operation of the audio circuit 31A according to the embodiment of the invention illustrated in FIG. 1 is described with reference to FIG. 2.

As illustrated in FIG. 2, when a power supply of the audio circuit (now shown) is turned on to apply voltage to the power supply terminals Vdds, the bias control signal BIASCNT is switched to a high level at time t1. Note that the switches S1 through S6 are all in off-states and the input terminal B of the switch S7 is in an on-state before time t1.

When the bias control signal BIASCNT is switched to a high level (i.e., turned on) at time t1, the control circuit 30 outputs control signals S1C and S3C to turn on the switches S1 and S3 at time t2 after a predetermined time has elapsed from time t1.

In the triangular voltage generator circuit 10, since the drain of the PMOS transistor M1 is connected to the constant current source I1, a drain current Id1 of the PMOS transistor M1 is equal to the constant current source I1.

Since the PMOS transistors M1 and M2, and M1 and M3 form a current mirror circuit, drain currents Id2 and Id3 of the PMOS transistors M2 and M3 are proportional to the current of the constant current source I1.

Further, a drain current Id4 of the NMOS transistor M4 becomes the drain current Id2 of the PMOS transistor M2.

Since the NMOS transistors M4 and M5 also form a current mirror circuit, a drain current Id5 of the NMOS transistor M5 is proportional to the current of the constant current source I1.

If the PMOS transistors M2 and M3 and the NMOS transistors M4 and M5 are formed of transistors having same characteristics, the drain current Id3 of the PMOS transistor M3 is equal to the drain current Id5 of the NMOS transistor M5.

At this moment, if the switch S1 is turned on, the drain current Id3 of the PMOS transistor M3 is all supplied to the capacitor C1. Accordingly, the terminal voltage VT1 of the capacitor C1 linearly rises as illustrated in FIG. 2. The terminal voltage VT1 of the capacitor C1 is input to the voltage current convertor circuit 20.

The terminal voltage VT1 of the capacitor C1 is supplied as an input voltage VT3 to the inverting input terminal (−) of the operating amplifier circuit 21 via the switch S7. The operating amplifier circuit 21 controls a voltage of the resistor R1 connected to the non-inverting input terminal (+) thereof to be equal to the input voltage VT3.

That is, the drain current Id6 of the PMOS transistor M6 is proportional to the input voltage VT3. Since the PMOS transistors M6 and M7 form a current mirror circuit, a drain current Id7 of the PMOS transistor M7 is also proportional to the current of the input voltage VT3.

The drain current Id7 of the PMOS transistor M7 becomes a drain current Id10 of the NMOS transistor M10. Since the NMOS transistors M10, M11 and M12 form a current mirror circuit, drain currents Id11 and Id12 of the NMOS transistors ML11 and M12 are proportional to the current of the voltage VT3.

Further, a drain current Id11 of the NMOS transistor M11 is supplied as a drain current Id8 of the NMOS transistor M8. Since the PMOS transistors M8 and M9 form a current mirror circuit, a drain current Id9 of the PMOS transistor M9 also is proportional to the current of the input voltage VT3.

If the NMOS transistors M11 and M12 and the PMOS transistors M8 and M9 are formed of transistors having same characteristics, a drain current Id9 of the PMOS transistor M9 is equal to a drain current Id12 of the NMOS transistor M12.

At this moment, if the switch S3 is turned on, the drain current Id9 of the PMOS transistor M9 is all supplied to the capacitor C2. Accordingly, the output voltage VT2 at the terminal of the capacitor C2 rises slowly first, however, its rising rate gradually gets faster.

The control circuit 30 is supplied with the output voltage VT2 of the output terminal T2 of the voltage current convertor circuit 20 and a ½ reference voltage Vref/2 obtained by dividing the reference voltage Vref by two (½). On detecting the output voltage VT2 having reached a ½ reference voltage Vref/2 at time t3, the control circuit 30 turns off the switch S1 and turns on the switch S2.

Subsequently, an electric charge held in the capacitor C1 is discharged via the switch S2 and the NMOS transistor M5. As described earlier, the drain current Id5 of the NMOS transistor M5 is equal to the drain current Id3 of the PMOS transistor M3. Thus, a voltage dropping rate of the capacitor C1 equals the voltage rising rate of the capacitor C1.

That is, the voltage VT1 of the output terminal T1 of the triangular voltage generator circuit 10 drops linearly at the same angle as when the output voltage VT1 output from the triangular voltage generator circuit 10 rises linearly.

In this time, in contrast with the case of the switch S1 being in an on-state, a rising rate of charging of the capacitor C1 of the triangular voltage generator circuit 10 slows down with time when the switch S2 is in an on-state.

Note that if the output voltage VT1 of the output terminal T1 of the triangular voltage generator circuit 10 is small; that is, if the amount of current supplied to the capacitor C2 from the output terminal 12 of the voltage current convertor circuit 20 is small, the output terminal T2 exhibits high output impedance. As a result, the audio circuit may operate in an unstable manner.

Consequently, the pop sound reduction circuit of the audio circuit may become susceptible to external effects, and the charging voltage of the capacitor C2 may not rise along with a desired voltage change.

To overcome such a drawback, the pop sound reduction circuit 32A of the audio circuit 31A according to the embodiment employs the following technique. Specifically, the control circuit 30 monitors the output voltage VT2 output from the voltage current convertor circuit 20 at time t4' where the voltage VT1 of the output terminal T1 of the triangular voltage generator circuit 10 is equal to or below a predetermined constant voltage VT1A. If the control circuit 30 determines that the output voltage VT2 of the output terminal T2 of the voltage current convertor circuit 20 is lower than a predetermined constant voltage VT2A, the control circuit 30 controls a connecting destination of a terminal C of the switch S7 to be switched from the input terminal B to the input terminal A.

When the connecting destination of the terminal C of the switch S7 is switched from the input terminal B to the input terminal A, the constant voltage Vdc output from the constant voltage circuit 60 is applied to the input terminal T3 of the voltage current convertor circuit 20. As a result, the input voltage VT3 has the constant voltage Vdc.

Accordingly, the drain current Id9 of the PMOS transistor M9 in the voltage current convertor circuit 20 remains constant based on the input voltage VT3, and the charging voltage of the capacitor C2 (i.e., output voltage VT2 of the voltage current convertor circuit 20) linearly rises at a constant rate.

Note that if the output voltage VT2 of the voltage current convertor circuit 20 exceeds the predetermined constant voltage VT2A at time t4', the control circuit 30 carries out no switching operation of the switch S7.

As illustrated in FIG. 2, the output voltage VT1 output from the triangular voltage generator circuit 10 (hereinafter called a "triangular voltage VT1") reaches its peak when the output voltage VT2 of the voltage current convertor circuit 20 reaches ½ of the reference voltage Vref. Subsequently, when the triangular voltage VT1 returns to the ground voltage Vss, the output voltage VT2 of the voltage current convertor circuit 20 approximately reaches the reference voltage Vref.

In addition, in this state, the output voltage VT2 of the voltage current convertor circuit 20 may underreach the reference voltage Vref due to external factors. However, if the connecting destination of the terminal C of the switch S7 is switched from the input terminal B to the input terminal A, the output voltage VT2 of the voltage current convertor circuit 20 may be raised to approximately the reference voltage Vref.

Accordingly, a voltage difference between the output voltage VT2 of the voltage current convertor circuit 20 and the reference voltage Vref may be minimized by raising the output voltage VT2 of the voltage current convertor circuit 20 approximately to the reference voltage Vref at time t4 when the switch S5 is turned on. Thus, the pop sound at time t4 may be lowered.

When the control circuit 30 determines that the output voltage VT2 of the voltage current convertor circuit 20 approximately has reached the reference voltage Vref, the control circuit 30 turns off the switches S2 and S3, and turns on the switch S5. Note that the control circuit 30 turns off the switches S2 and S3, and turns on the switch S5 at the time where discharging of the capacitor C1 and charging of the capacitor C2 after turning on the switch S2 have stopped, or at time t4 after a predetermined time has elapsed from the time where discharging of the capacitor C1 and charging of the capacitor C2 have stopped.

As described above, at time t4, turning off of the switch S2 causes a charging path for charging of the capacitor C1 by the NMOS transistor M5 to be cut off, and likewise, turning off of the switch S3 causes a discharging path for discharging of the capacitor C2 by the PMOS transistor M9 to be cut off.

When the switch S5 is turned on, the capacitor C2 is applied with the reference voltage Vref via the resistor R2. Accordingly, even if the voltage of the capacitor C2 is slightly different from the reference voltage Vref, the voltage of the capacitor C2 can be equal to the reference voltage Vref by turning on the switch S5 at time t4.

As a result, the non-inverting input terminal (+) of the differential amplifier circuit 50 is constantly supplied with the reference voltage Vref while the audio circuit 31A is in operation.

Accordingly, the audio circuit 31A according to the embodiment can be fully activated by applying half (½) of the reference voltage thereto, and its applied voltage exhibits a fully symmetric voltage waveform. In addition, there is no polarity change point of the voltage waveform in a middle of activation of the audio circuit, which reduces the harmonic content. As a result, the audio circuit 31A according to the embodiment is capable of significantly reducing pop sound.

Further, in the audio circuit 31A according to the embodiment, insufficient charging voltage of the capacitor due to unstable circuit operation in the middle of activation of the audio circuit may be compensated, thereby minimizing the generation of pop sound.

Next, deactivation of the audio circuit 31A according to the embodiment is described.

When the audio circuit 31A is deactivated by turning the power supply off, the bias control signal BIASCNT is switched to a low level at time t5. The control circuit 30 turns off the switch S5, and turns on the switches S1 and S4 at time t6 after a predetermined time has elapsed from time t5.

When the switch S5 is turned off, no reference voltage Vref is applied to the capacitor C2 from the reference voltage circuit 40.

The triangular voltage generator circuit 10 operates in the same manner between a time when the switch S1 is turned on and a time when the power supply is turned on, and its description is thus omitted.

When the switch S4 is turned on, an electric charge held in the capacitor C2 is discharged via the switch S4 and the NMOS transistor M12. As illustrated in FIG. 2, the output voltage VT2 of the voltage current convertor circuit 20 slowly drops immediately after turning on of the switch S4, however, its dropping rate gradually increases.

When the output voltage VT2 of the voltage current convertor circuit 20 reaches a ½ of the reference voltage Vref (i.e., Vref/2), the control circuit 30 turns off the switch S1 and turns on the switch S2. At this moment, the triangular voltage VT1 begins to drop in an inversely similar angle of the slope thereof obtained when the power supply is turned on. Accordingly, a dropping rate of the output voltage VT2 gradually slows down.

As already illustrated in FIG. 3, if the voltage VT1 of the output terminal T1 of the triangular voltage generator circuit 3 is small; that is, if the amount of current supplied to the capacitor C2 from the output terminal T2 of the voltage current convertor circuit 20 is small, the output terminal T2 exhibits high output impedance. Accordingly, the audio circuit (or pop sound reduction circuit) may operate in an unstable manner.

Consequently, the audio circuit may become susceptible to external effects, and the charging voltage of the capacitor C2 may not be decreased along with a desired voltage change.

To overcome such a drawback, the pop sound reduction circuit of the audio circuit 31A according to the embodiment employs the following technique. Specifically, the control circuit 30 monitors the output voltage VT2 of the voltage current convertor circuit 20 at time 8' where the voltage VT1 of the output terminal of the triangular voltage generator circuit 10 is equal to or below the predetermined constant voltage VT1A. If the control circuit 30 determines that the output voltage VT2 of the voltage current convertor circuit 20 is not lower than another predetermined constant voltage VT2B, the control circuit 30 controls a connecting destination of the terminal C of the switch S7 to be switched from the input terminal B to the input terminal A.

Accordingly, when the connecting destination of the terminal C of the switch S7 is switched from the input terminal B to the input terminal A, the constant voltage Vdc output from the constant voltage circuit 60 is applied to the input terminal T3 of the voltage current convertor circuit 20. As a result, the input voltage VT3 is equal to the constant voltage Vdc.

Accordingly, the drain current Id12 of the NMOS transistor M12 in the voltage current convertor circuit 20 remains constant due to the input voltage VT3 being the constant voltage Vdc, and the charging voltage of the capacitor C2 linearly drops at a constant rate.

Note that if the output voltage VT2 of the voltage current convertor circuit 20 is below the predetermined constant voltage VT2A at time t8', the control circuit 30 carries out no switching operation of the switch S7.

The control circuit 30 turns off the switches S2 and S4 and turns on the switch S6 at the time where discharging of the capacitor C1 after turning on the switch S2 is completed, or at time t8 after a predetermined time has elapsed from the time where discharging of the capacitor C1 is completed.

As described above, at time t8, turning off of the switch S2 causes a charging path for charging of the capacitor C1 by the NMOS transistor M5 to be cut off, and likewise, turning off of the switch S4 causes a charging path for charging of the capacitor C2 by the NMOS transistor M12 to be cut off.

When the switch S6 is turned on, the capacitor is connected to a ground terminal via the resistor R3. As a result, the voltage of the capacitor C2 is equal to the ground voltage.

As described above, when the audio circuit is deactivated by turning off the power supply, a reference voltage having a waveform symmetrical to the reference voltage at the activation of the audio circuit may be applied as the reference voltage of the audio circuit. Accordingly, the pop sound may significantly be reduced when turning off the power supply of the audio circuit.

Further, in the audio circuit 31A according to the embodiment, insufficient discharging of the capacitor due to unstable circuit operation in the middle of deactivation of the audio circuit may be compensated, thereby minimizing the generation of pop sound.

As described above with reference to FIGS. 1 and 2, the pop sound reduction circuit 32A and the audio circuit 31A having the pop sound reduction circuit 32A according to the embodiment for use in an audio amplifier includes: the differential amplifier circuit 50 having the first input terminal to which the reference voltage Vref may be applied as a first input and the second input terminal to which an audio signal IN is supplied as a second input; the triangular voltage generator circuit 10 configured to generate a triangular voltage when an audio circuit is activated or deactivated; the constant voltage circuit 60 configured to generate a constant voltage; the voltage current convertor circuit 20 configured to receive a triangular voltage output from the triangular voltage generator circuit 10 or a constant voltage output from the constant voltage circuit 60 to generate a current proportional to the triangular voltage output from the triangular voltage generator circuit 10 or the constant voltage output from the constant voltage circuit 60; and the capacitor C2 configured to be charged with the current generated from the voltage current convertor circuit 20 or discharge the charged current. In the pop sound reduction circuit 32A and the audio circuit 31A having the pop sound reduction circuit 32A according to the embodiment, when the audio amplifier is activated, the capacitor C2 is charged with the current generated from the voltage current convertor circuit 20 to generate a charging voltage as the reference voltage for the audio amplifier. If the voltage charged with the capacitor C2 is not raised approximately to the reference voltage Vref generated by the reference voltage circuit 40, the constant voltage output from the constant voltage circuit 60 is applied to the voltage current convertor circuit 20. In this manner, the voltage current convertor circuit 20 may output a constant current around an end of a charging period of the capacitor C2. Accordingly, the capacitor C2 may be charged in a stable manner.

Further, the capacitor C2 discharges the charged current output from the voltage current convertor circuit 20 at the deactivation of the audio amplifier based on the voltage generated by the capacitor C2 as a reference voltage of the audio amplifier. However, if the voltage obtained by the charge of the capacitor C2 is yet to be reduced approximately to the ground voltage Vss around the end of the triangular voltage waveform of the triangular voltage output from the triangular voltage generator circuit 10, the constant voltage generated by the constant voltage circuit 60 is applied to the voltage current convertor circuit 20. In this manner, the voltage current convertor circuit 20 may output a constant current around an end of a discharging period of the capacitor C2. Accordingly, the capacitor C2 may be discharged in a stable manner.

Moreover, if the voltage of the capacitor C2 is approximately equal to the reference voltage Vref at the activation of the audio amplifier, the reference voltage is applied from the reference voltage circuit 40 to the capacitor C2 via the resistor R2. With this configuration, the voltage of the capacitor C2 after the activation of the audio amplifier may be set at the reference voltage Vref.

Furthermore, when the voltage of the capacitor C2 is approximately equal to the ground voltage Vss at the deactivation of the audio amplifier, the ground voltage Vss is applied to the capacitor C2 via the resistor R3. With this configuration, the capacitor C2 after the deactivation of the audio amplifier may completely discharge electric charges.

According to the aforementioned embodiment of the invention, there is provided a pop sound reduction circuit for use in an audio amplifier configured to reduce generation of pop sound at activation or deactivation of the audio amplifier. The pop sound reduction circuit includes: a reference voltage circuit configured to generate a reference voltage; a differential amplifier circuit having a first input terminal capable of being applied with the reference voltage generated by the reference voltage circuit as a first input and a second input terminal supplied with an audio signal from an external audio source as a second input, the differential amplifier circuit configured to amplify the audio signal based on a comparison between the first input and the second input; a triangular voltage generator circuit configured to generate a triangular voltage at the activation or deactivation of the audio amplifier; a voltage current convertor circuit configured to acquire the triangular voltage generated by the triangular voltage generator circuit to generate a current proportional to the triangular voltage; a capacitor configured to be, at the activation of the audio amplifier, charged with the current proportional to the triangular voltage generated by the voltage current convertor to generate a voltage corresponding to the current proportional to the triangular voltage capable of being applied to the first input terminal of the differential amplifier circuit as the first input; a constant voltage circuit configured to generate a constant voltage; and a control circuit configured to measure, at the activation of the audio amplifier, the triangular voltage generated by the triangular voltage generator circuit and the voltage corresponding to the current proportional to the triangular voltage generated by the capacitor, respectively, and to switch between one of the triangular voltage generated by the triangular voltage generator circuit and the constant voltage generated by the constant voltage generator circuit to be applied to the voltage current convertor circuit. In the pop sound reduction circuit, if the voltage corresponding to the current proportional to the triangular voltage generated by the capacitor has not be raised to reach the reference voltage generated by the reference voltage circuit at a time where the triangular voltage generated by the triangular voltage generator circuit is reduced to be equal to or below a first predetermined voltage, the control circuit switches the triangular voltage generated by the triangular voltage generator circuit applied to the voltage current convertor circuit into the constant voltage generated by the constant voltage generator circuit to be applied to the voltage current convertor circuit so as to increase the voltage corresponding to the current proportional to the triangular voltage generated by the capacitor. With the above configuration, the voltage current convertor circuit may output a constant current around at an end of the charging period of the capacitor. Accordingly, the capacitor may be charged in a stable manner. Further, with this configuration, when the capacitor discharges the charged current output from the voltage current convertor circuit, and the voltage obtained by the charge of the capacitor is yet to be reduced approximately to the ground voltage around the end of the triangular voltage waveform of the triangular voltage output from the triangular voltage generator circuit at the deactivation of the audio amplifier, the current output from the voltage current convertor circuit may be constant around at an end of a discharging period of the capacitor. Accordingly, the capacitor may be discharged in a stable manner with a stable circuit configuration.

The audio circuit having the popping sound reduction circuit according to the above embodiment of the invention provides a more stable pop sound reduction operation and an improved performance corresponding to the stable pop sound reduction operation.

The present invention is not limited to the specifically disclosed embodiment, and variations and modifications may be made without departing from the scope of the present invention.

This patent application is based on Japanese Priority Patent Application No. 2009-170060 filed on Jul. 21, 2009, the entire contents of which are hereby incorporated herein by reference.

The invention claimed is:

1. A pop sound reduction circuit for use in an audio amplifier configured to reduce generation of pop sound at activation or deactivation of the audio amplifier, the pop sound reduction circuit, comprising:

a reference voltage circuit configured to generate a reference voltage;

a differential amplifier circuit having a first input terminal capable of being applied with the reference voltage generated by the reference voltage circuit as a first input and a second input terminal supplied with an audio signal from an external audio source as a second input, the differential amplifier circuit configured to amplify the audio signal based on a comparison between the first input and the second input;

a triangular voltage generator circuit configured to generate a triangular voltage at the activation or deactivation of the audio amplifier;

a voltage to current convertor circuit configured to acquire the triangular voltage generated by the triangular voltage generator circuit to generate a current proportional to the triangular voltage;

a capacitor configured to be, at the activation of the audio amplifier, charged with the current proportional to the triangular voltage generated by the voltage to current convertor to generate a voltage corresponding to the current proportional to the triangular voltage capable of being applied to the first input terminal of the differential amplifier circuit as the first input;

a constant voltage circuit configured to generate a constant voltage; and a control circuit configured to measure, at the activation of the audio amplifier, the triangular voltage generated by the triangular voltage generator circuit and the voltage corresponding to the current proportional to the triangular voltage generated by the capacitor, respectively, and to switch between one of the triangular voltage generated by the triangular voltage generator circuit and the constant voltage generated by the constant voltage generator circuit to be applied to the voltage to current convertor circuit, wherein if the voltage corresponding to the current proportional to the triangular voltage generated by the capacitor has not be raised to reach the reference voltage generated by the reference voltage circuit at a time where the triangular voltage generated by the triangular voltage generator circuit is reduced to be equal to or below a first predetermined voltage, the control circuit switches the triangular voltage generated by the triangular voltage generator circuit applied to the voltage to current convertor circuit into the constant voltage generated by the constant voltage generator circuit to be applied to the voltage to current convertor circuit so as to increase the voltage corresponding to the current proportional to the triangular voltage generated by the capacitor.

2. The pop sound reduction circuit as claimed in claim 1, wherein the control circuit causes, at the deactivation of the audio amplifier, to discharge the capacitor while applying the voltage corresponding to the current proportional to the triangular voltage generated by the capacitor to the first input terminal of the differential amplifier circuit, and wherein if the voltage corresponding to the current proportional to the triangular voltage generated by the capacitor is not reduced to reach a ground voltage at a time where the triangular voltage generated by the triangular voltage generator circuit is reduced to be equal to or below the first predetermined voltage, the control circuit switches the triangular voltage generated by the triangular voltage generator circuit applied to the voltage to current convertor circuit into the constant voltage generated by the constant voltage generator circuit to be applied to the voltage to current convertor circuit so as to decrease the voltage corresponding to the current proportional to the triangular voltage generated by the capacitor.

3. The pop sound reduction circuit as claimed in claim 1, wherein the control circuit applies the reference voltage generated by the reference voltage generator circuit to the capacitor via a first resistor at a time where the voltage corresponding to the current proportional to the triangular voltage generated by the capacitor is approximately equal to the reference voltage generated by the reference voltage circuit at the activation of the audio amplifier.

4. The pop sound reduction circuit as claimed in claim 2, wherein the control circuit applies a ground voltage to the capacitor via a second resistor at a time where the voltage corresponding to the current proportional to the triangular voltage generated by the capacitor is approximately equal to the ground voltage at the deactivation of the audio amplifier.

5. An audio circuit for use in an audio amplifier, the audio circuit comprising:
a power amplifier unit including the differential amplifier circuit and a resistor coupling an output of the differential amplifier circuit to the second input terminal of the differential amplifier circuit; and
the pop sound reduction circuit configured to reduce the generation of pop sound at the activation or deactivation of the audio amplifier as claimed in claim 1.

* * * * *

UNITED STATES PATENT AND TRADEMARK OFFICE
CERTIFICATE OF CORRECTION

PATENT NO. : 8,525,589 B2
APPLICATION NO. : 13/321221
DATED : September 3, 2013
INVENTOR(S) : Masayuki Doi Page 1 of 1

It is certified that error appears in the above-identified patent and that said Letters Patent is hereby corrected as shown below:

On the Title Page, Item (54) and in the Specification, column 1, replace the title with the following:

-- POP SOUND REDUCTION CIRCUIT AND AUDIO CIRCUIT
HAVING SUCH POP SOUND REDUCTION CIRCUIT FOR USE IN
AUDIO AMPLIFIER --

Signed and Sealed this
Thirty-first Day of December, 2013

Margaret A. Focarino
*Commissioner for Patents of the United States Patent and Trademark Office*